(12) United States Patent
Liu et al.

(10) Patent No.: US 11,205,873 B2
(45) Date of Patent: Dec. 21, 2021

(54) CONNECTOR CAGE AND RADIATOR

(71) Applicant: Tyco Electronics (Shanghai) Co. Ltd., Shanghai (CN)

(72) Inventors: Wenyu Liu, Shanghai (CN); Hongqiang Han, Shanghai (CN); Lizhou Li, Shanghai (CN); Xingjie Ge, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/830,022

(22) Filed: Mar. 25, 2020

(65) Prior Publication Data
US 2020/0312745 A1 Oct. 1, 2020

(30) Foreign Application Priority Data

Mar. 25, 2019 (CN) .......................... 201910246385.2

(51) Int. Cl.
| | |
|---|---|
| *H01L 23/40* | (2006.01) |
| *H01L 23/367* | (2006.01) |
| *H01R 13/508* | (2006.01) |
| *H05K 7/20* | (2006.01) |
| *G02B 6/42* | (2006.01) |

(52) U.S. Cl.
CPC ....... *H01R 13/508* (2013.01); *H01L 23/4093* (2013.01); *G02B 6/4269* (2013.01); *H01L 23/3672* (2013.01); *H05K 7/20509* (2013.01)

(58) Field of Classification Search
CPC ............. H05K 7/1401; H05K 7/20154; H05K 7/20418–20454; H05K 7/2049; H05K 1/181; H01L 23/4093; H01L 23/3672; H01L 2023/4043; H01L 2023/405; H01L 2023/4062; H01L 2023/4087; H01R 13/426; H01R 13/502–514; H01R 13/6335; H01R 13/6275; H01R 13/6581–6591; H01R 13/659; H01R 13/6598; H01R 13/665; H01R 13/6596; F21V 29/50; F28F 3/06; F28F 9/001
See application file for complete search history.

(56) References Cited

U.S. PATENT DOCUMENTS

| | | | |
|---|---|---|---|
| 6,269,863 B1 * | 8/2001 | Wyler ....................... | G06F 1/20 165/185 |
| 6,606,246 B2 * | 8/2003 | Wells .................. | H01L 23/4093 165/185 |

(Continued)

*Primary Examiner* — Zachary Pape
*Assistant Examiner* — Amir A Jalali
(74) *Attorney, Agent, or Firm* — Barley Snyder

(57) ABSTRACT

A connector includes a cage having a plurality of receiving chambers, a separation mechanism including a lower separation plate and an upper separation plate, a radiator disposed between the lower separation plate and the upper separation plate, and an elastic clip mounted on the radiator and elastically holding the radiator in the separation mechanism. The separation mechanism is located between and separates a pair of adjacent receiving chambers of the plurality of receiving chambers in a height direction of the connector. A pair of sides of the elastic clip opposite to each other in a lateral direction of the radiator are fixed between the lower separation plate and the upper separation plate.

20 Claims, 3 Drawing Sheets

(56) References Cited

U.S. PATENT DOCUMENTS

| | | | | |
|---|---|---|---|---|
| 7,736,153 B2* | 6/2010 | Cheng | ............... | G06F 1/20 |
| | | | | 439/66 |
| 7,924,567 B2* | 4/2011 | Zha | ............... | H01L 23/467 |
| | | | | 361/710 |
| 7,929,306 B2* | 4/2011 | Hernon | ............. | H01L 23/427 |
| | | | | 361/700 |
| 8,449,331 B2* | 5/2013 | Phillips | ........... | H01R 13/6581 |
| | | | | 439/607.21 |
| 8,568,171 B2* | 10/2013 | Yang | ............. | H01R 13/502 |
| | | | | 439/607.27 |
| 9,668,335 B1* | 5/2017 | Canseco | .......... | F28F 3/02 |
| 9,681,583 B2* | 6/2017 | Lei | ............... | H05K 7/20409 |
| 9,847,273 B2* | 12/2017 | Lin | ............... | F16B 2/22 |
| 2017/0054234 A1* | 2/2017 | Kachlic | ......... | H01R 13/6594 |
| 2017/0192185 A1* | 7/2017 | Kelty | ............ | H04B 10/801 |
| 2018/0129000 A1* | 5/2018 | Liu | ................ | G02B 6/4261 |
| 2018/0337476 A1* | 11/2018 | Ritter | ............ | H01R 12/721 |
| 2019/0115684 A1* | 4/2019 | Khazen | .......... | H05K 7/20727 |
| 2019/0116692 A1* | 4/2019 | Little | ............ | H05K 7/20418 |
| 2019/0288448 A1* | 9/2019 | Liu | ................ | H01R 13/6271 |
| 2019/0387650 A1* | 12/2019 | Zhou | ............. | G02B 6/4261 |
| 2020/0076141 A1* | 3/2020 | Wang | ............ | H05K 1/184 |
| 2020/0091637 A1* | 3/2020 | Scholeno | ........ | H01R 12/712 |
| 2020/0194913 A1* | 6/2020 | Avery | ............ | H01R 13/514 |
| 2020/0257067 A1* | 8/2020 | Meunier | ......... | H05K 7/2049 |
| 2020/0275587 A1* | 8/2020 | Chopra | .......... | H05K 7/2039 |
| 2020/0295498 A1* | 9/2020 | Lloyd | ............ | G02B 6/4261 |

* cited by examiner

CONNECTOR CAGE AND RADIATOR

CROSS-REFERENCE TO RELATED APPLICATION

This application claims the benefit of the filing date under 35 U.S.C. § 119(a)-(d) of Chinese Patent Application No. 201910246385.2, filed on Mar. 25, 2019.

FIELD OF THE INVENTION

The present invention relates to a connector and, more particularly, to a connector with a radiator.

BACKGROUND

A connector with layers of receiving chambers generally includes a cage, a separation layer arranged in the cage, a radiator assembled in the separation layer, and an elastic clip assembled on the radiator. The separation layer separates an upper receiving chamber from a lower receiving chamber adjacent to the upper receiving chamber. The elastic clip holds the radiator elastically in the separation layer. The radiator thermally contacts a plug module inserted into the lower receiving chamber below the separation layer.

The elastic clip has a plate-like main body part and a spring piece at a center position of the plate-like main body part. The plate-like main body part of the elastic clip is directly pressed on fins of the radiator, and the spring piece of the elastic clip abuts against a center part of a bottom surface of an upper separation plate of the separation layer, so as to hold the radiator in the separation layer.

The spring piece of the elastic clip, however, abuts against the center part of the bottom surface of the upper separation plate of the separate layer. When the elastic clip is pushed upward, it causes the upper separation plate to deform elastically upward, which leads to the whole elastic clip moving upward and reducing the elastic pressing force of the elastic clip exerted on the radiator, thus reducing the thermal contact performance and heat dissipation efficiency of the radiator. Additionally, because the plate-like main body part of the elastic clip is directly pressed on the top surface of the fins of the radiator, the fins are easily crushed.

SUMMARY

A connector includes a cage having a plurality of receiving chambers, a separation mechanism including a lower separation plate and an upper separation plate, a radiator disposed between the lower separation plate and the upper separation plate, and an elastic clip mounted on the radiator and elastically holding the radiator in the separation mechanism. The separation mechanism is located between and separates a pair of adjacent receiving chambers of the plurality of receiving chambers in a height direction of the connector. A pair of sides of the elastic clip opposite to each other in a lateral direction of the radiator are fixed between the lower separation plate and the upper separation plate.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
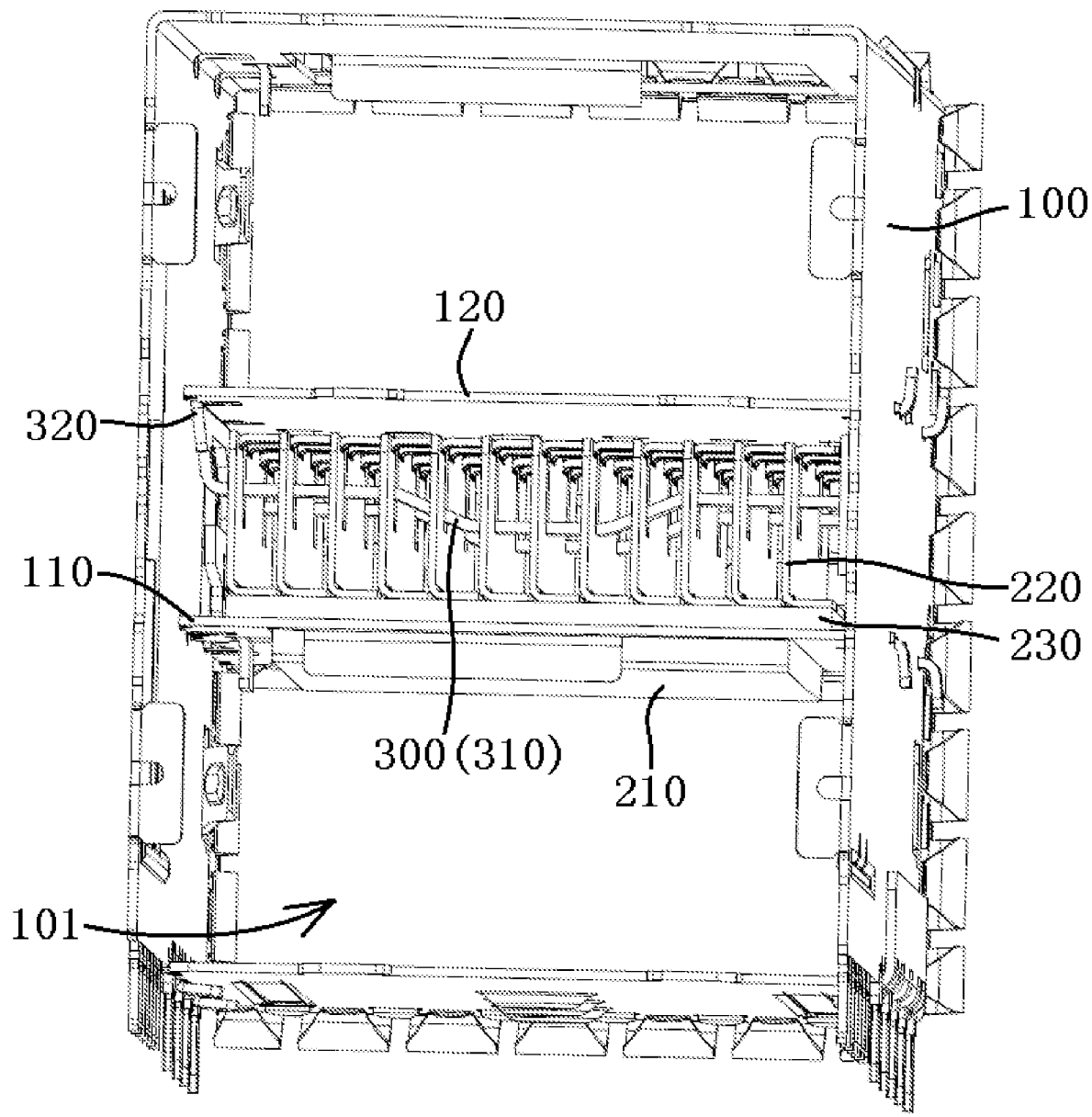
FIG. 1 is a perspective view of a connector according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A connector according to an embodiment, as shown in FIG. 1, comprises a cage 100, a separation mechanism 110, 120, a radiator 200, and an elastic clip 300. The cage 100 has a plurality of receiving chambers 101. The separation mechanism 110, 120 includes a lower separation plate 110 and an upper separation plate 120. The separation mechanism 110, 120 is located between two adjacent receiving chambers 101 in a height direction of the connector to separate the two adjacent receiving chambers 101 from each other. The radiator 200 is provided between the lower separation plate 110 and the upper separation plate 120. The elastic clip 300 is mounted on the radiator 200 and configured to elastically hold the radiator 200 in the separation mechanism 110, 120.

As shown in FIG. 1, a pair of sides of the elastic clip 300 opposite to each other in a lateral direction X of the radiator 200 are fixed between the lower separation plate 110 and the upper separation plate 120. The fixation of the sides of the elastic clip 300 prevent the elastic clip 300 from being moved upward when the elastic clip 300 is pushed upward.

Figure 2:
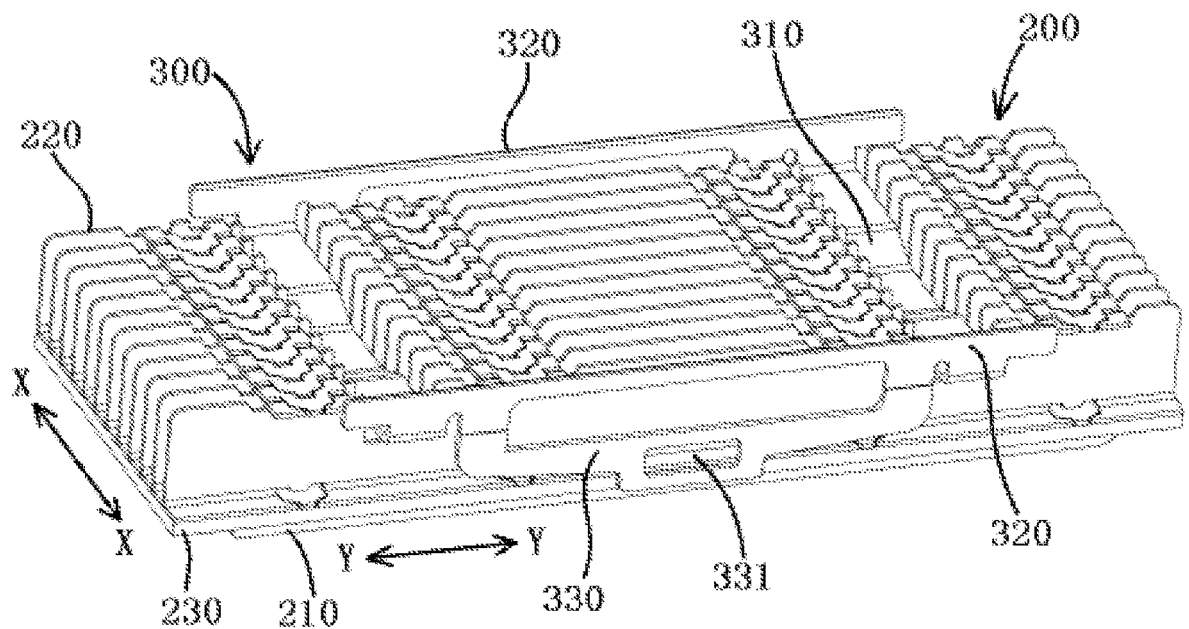
FIG. 2 is a perspective view of a radiator and an elastic clip of the connector of FIG. 1.
Figure 3:
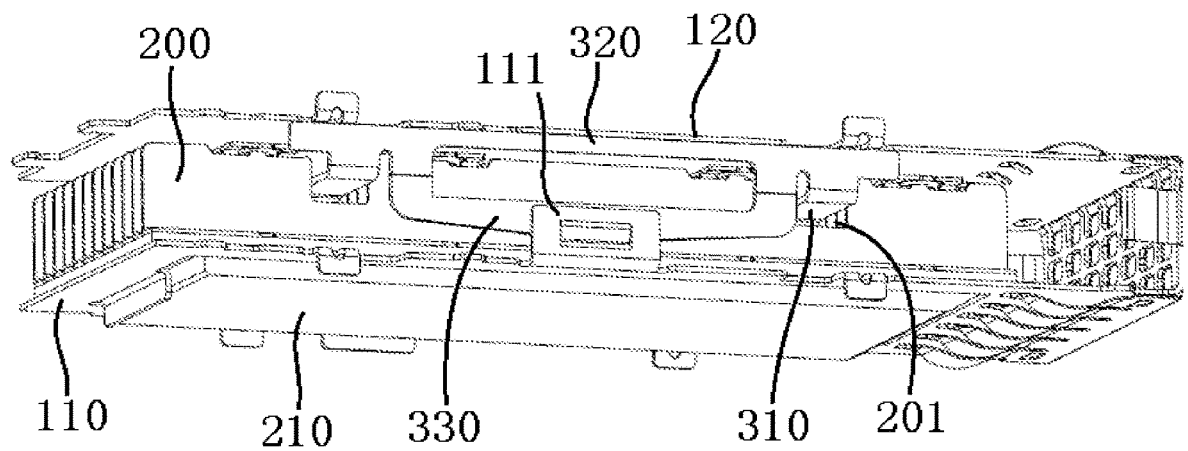
FIG. 3 is a perspective view of the radiator and the elastic clip of FIG. 2 in a separation mechanism of the connector.

The elastic clip 300, as shown in FIGS. 1-3, has a pair of longitudinal beams 320 extending in a longitudinal direction Y of the radiator 200. The pair of longitudinal beams 320 are respectively located at either side of the radiator 200 in the lateral direction X. The pair of longitudinal beams 320 of the elastic clip 300 respectively abut against a pair of sides of the upper separation plate 120 in the lateral direction X. Because the two sides of the upper separation plate 120 in the lateral direction X are fixed to the cage 100, the pair of longitudinal beams 320 of the elastic clip 300 can be fixed between the lower separation plate 110 and the upper separation plate 120, preventing the elastic clip 300 from being moved upward when being subject to an upward pushing force. The prevention of movement of the elastic clip 300 improves the elastic pressing force exerted on the radiator 200 by the elastic clip 300, and improves the heat contact performance and heat dissipation effect of the radiator 200.

The elastic clip 300, as shown in FIGS. 1 and 2, has at least one elastic transversal beam 310 connected between the pair of longitudinal beams 320. The elastic transversal beam 310 is adapted to apply a downward elastic pressing force onto the radiator 200 through its elastic deformation.

As shown in FIGS. 2 and 3, at least one transversal groove 201 extending in the lateral direction X is formed in the radiator 200. The elastic transversal beam 310 is received in the transversal groove 201. The elastic transversal beam 310 is arched downward. In this way, when being pressed, the elastic transversal beam 310 is elastically deformed, so as to apply downward elastic pressing force onto the radiator 200.

As shown in FIG. 1, the elastic clip 300 is locked onto the lower separation plate 110. Thus, the radiator 200 may be preassembled onto the lower separation plate 110 through the elastic clip 300, and then be assembled into the cage 100 together with the lower separation plate 110.

The elastic clip 300, as shown in FIGS. 2 and 3, has a pair of outer elastic pieces 330. The pair of outer elastic pieces 330 are respectively connected to the outer sides of the pair of longitudinal beams 320. A snap slot 331 is formed in each of the pair of outer elastic pieces 330, and a latch 111 is formed on each of a pair of opposite sides of the lower separation plate 110. The latch 111 is adapted to be locked in the snap slot 331, so as to preassemble the radiator 200 onto the lower separation plate 110.

As shown in FIGS. 1 and 2, the radiator 200 has a base plate 230, a boss 210 on a bottom surface of the base plate 230, and a plurality of fins 220 on a top surface of the base plate 230. The boss 210 of the radiator 200 protrudes into the receiving chamber 101 through an opening formed in the lower separation plate 110, so as to thermally contact a plug module of a mating connector inserted into the receiving chamber 101. The base plate 230 of the radiator 200 is placed on a top surface of the lower separation plate 110, and the fins 220 of the radiator 200 are located between the lower separation plate 110 and the upper separation plate 120. Two adjacent fins 220 are spaced apart by a predetermined distance so as to form a heat dissipation channel between the two adjacent fins 220.

As shown in FIGS. 1-3, the top surfaces of the pair of longitudinal beams 320 are higher than the top surfaces of the fins 220, so that there is a predetermined gap between the top surfaces of the fins 220 and the upper separation plate 120. The pair of longitudinal beams 320 and the fins 220 are parallel to each other and perpendicular to the base plate 230.

Figure 4:
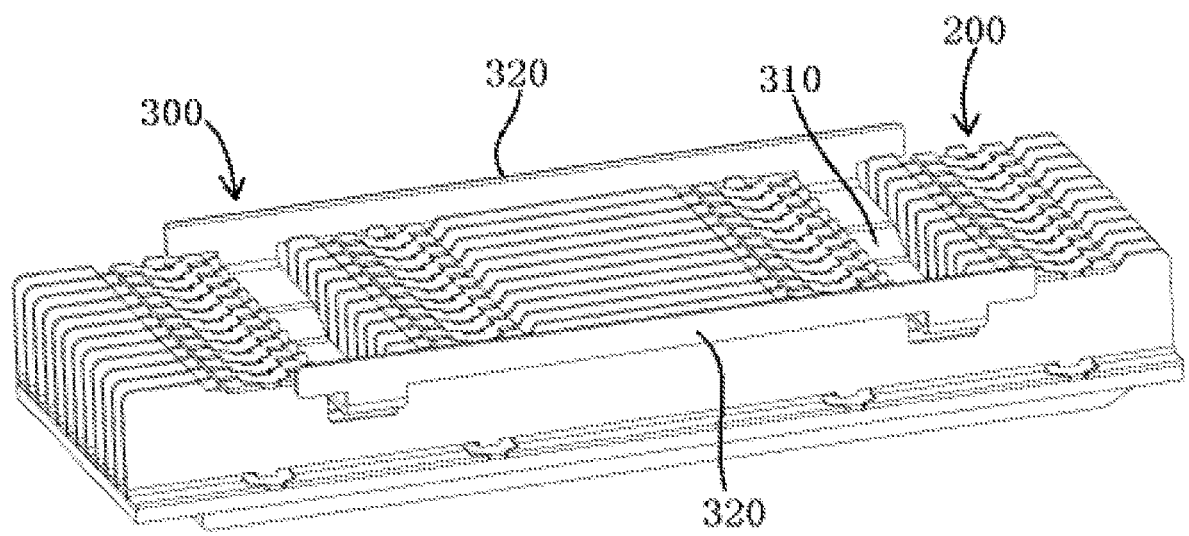
FIG. 4 is a perspective view of a radiator and an elastic clip of according to another embodiment.
Figure 5:
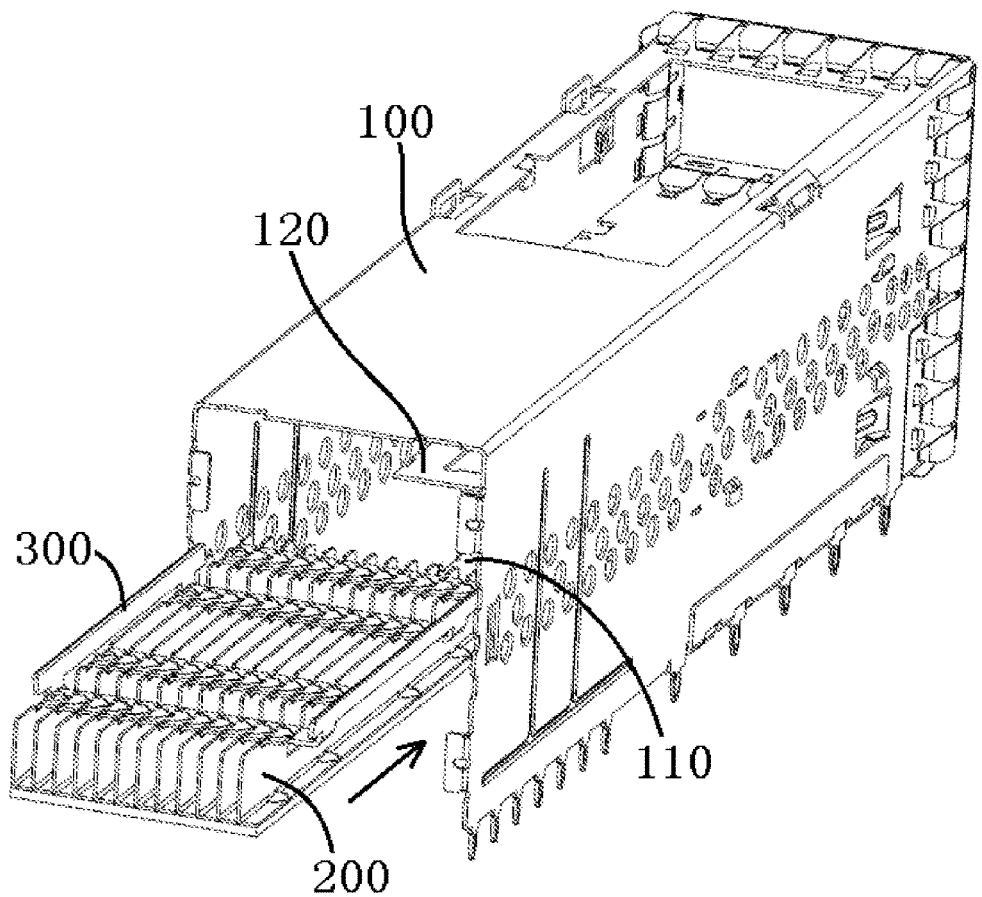
FIG. 5 is a perspective view of the radiator and the elastic clip of FIG. 4 in a cage of a connector.

A radiator 200 and an elastic clip 300 according to another embodiment is shown in FIG. 4. The radiator 200 and the elastic clip 300 of the embodiment of FIG. 4 are shown inserted into a cage 100 in FIG. 5. The embodiments shown in FIGS. 4 and 5 remove the latch structures for locking the elastic clip 300 and the lower separation plate 110 from the elastic clip 300 and the lower separation plate 110 of the embodiments shown in FIG. 1-3. That is, in the embodiments shown in FIGS. 4 and 5, there is not provided, on the elastic clip 300 and the lower separation plate 110, any connection structure for connecting the elastic clip 300 and the lower separation plate 110 together. In this way, the radiator 200 installed with the elastic clip 300 may be conveniently inserted into a space between the lower separation plate 110 and the upper separation plate 120 assembled in the cage 100, as shown in FIGS. 4 and 5.

It should be appreciated for those skilled in this art that the above embodiments are intended to be illustrative, and not restrictive. For example, many modifications may be made to the above embodiments by those skilled in this art, and various features described in different embodiments may be freely combined with each other without conflicting in configuration or principle. Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A connector, comprising:
    a cage having a plurality of receiving chambers;
    a separation mechanism including a lower separation plate and an upper separation plate, the separation mechanism located between and separating a pair of adjacent receiving chambers of the plurality of receiving chambers in a height direction of the connector;
    a radiator disposed between the lower separation plate and the upper separation plate; and
    an elastic clip mounted on the radiator and elastically holding the radiator in the separation mechanism, a pair of sides of the elastic clip opposite to each other in a lateral direction of the radiator are fixed between the lower separation plate and the upper separation plate, the elastic clip having a pair of longitudinal beams extending in a longitudinal direction of the radiator and an elastic transversal beam connected between the pair of longitudinal beams, each longitudinal beam extending from the elastic traversal beam in an upward direction and abutting against one of a pair of lateral sides of the upper separation plate in the lateral direction and preventing the elastic clip from moving in the upward direction when the elastic clip is pushed in the upward direction.

2. The connector of claim 1, wherein the pair of longitudinal beams are located at a pair of opposite sides of the radiator in the lateral direction.

3. The connector of claim 2, wherein the pair of longitudinal beams each define an upwardly extending free edge abutting against the upper separation plate in the upward direction.

4. The connector of claim 1, wherein the elastic transversal beam applies a downward elastic pressing force onto the radiator opposite to the upward direction through elastic deformation of the elastic transversal beam.

5. The connector of claim 4, wherein the radiator has a transversal groove extending in the lateral direction, the elastic transversal beam is received in the transversal groove.

6. The connector of claim 5, wherein the elastic transversal beam is arched downward.

7. The connector of claim 1, wherein the elastic clip is directly locked onto the lower separation plate.

8. The connector of claim 7, wherein the radiator is preassembled onto the lower separation plate with the elastic clip and is assembled into the cage together with the lower separation plate.

9. The connector of claim 1, wherein the elastic clip has a pair of outer elastic pieces, the outer elastic pieces are connected to a pair of outer sides of the longitudinal beams.

10. The connector of claim 9, wherein a snap slot is formed in each of the outer elastic pieces.

11. The connector of claim 10, wherein a latch is formed on each of a pair of sides on the lower separation plate, the latch is locked into the snap slot to assemble the radiator on the lower separation plate.

12. The connector of claim 1, wherein the radiator assembled with the elastic clip is inserted between the lower separation plate and the upper separation plate assembled in the cage.

13. The connector of claim 1, wherein the radiator has a base plate, a boss on a bottom surface of the base plate, and a plurality of fins on a top surface of the base plate.

14. The connector of claim 13, wherein the boss protrudes into the receiving chamber through an opening in the lower separation plate for thermally contacting a plug module inserted into the receiving chamber.

15. The connector of claim 14, wherein the base plate of the radiator is placed on a top surface of the lower separation plate and the fins are between the lower separation plate and the upper separation plate.

16. The connector of claim 15, wherein a top surface of each of the longitudinal beams is higher than a top surface of each of the fins by a predetermined gap.

17. The connector of claim 13, wherein the longitudinal beams and the fins are parallel to each other and perpendicular to the base plate.

18. The connector of claim 17, wherein a pair of adjacent fins of the plurality of fins are spaced apart by a predetermined distance to form a heat dissipation channel between the pair of adjacent fins.

19. A connector, comprising:
  a cage having a plurality of receiving chambers;
  a separation mechanism including a lower separation plate and an upper separation plate, the separation mechanism located between and separating a pair of adjacent receiving chambers of the plurality of receiving chambers in a height direction of the connector;
  a radiator disposed between the lower separation plate and the upper separation plate; and
  an elastic clip mounted on the radiator and elastically holding the radiator in the separation mechanism, a pair of sides of the elastic clip opposite to each other in a lateral direction of the radiator are fixed between the lower separation plate and the upper separation plate, the elastic clip locked directly onto the lower separation plate and including:
    a pair of longitudinal beams extending in a longitudinal direction of the radiator;
  and
    a pair of elastic transversal beams connected between the pair of longitudinal beams, each longitudinal beam extending from the elastic traversal beams in an upward direction and abutting against a respective side of the upper separation plate for preventing the elastic clip from moving in the upward direction when the elastic clip is biased in the upward direction.

20. The connector of claim 19, wherein the elastic clip has a pair of outer elastic pieces connected to a pair of outer sides of the longitudinal beams, each elastic piece arranged between the pair of elastic transversal beams on a respective one of the longitudinal beams and defining an open snap slot formed therethrough, each of the pair of sides of the lower separation plate defining a latch engaging within the open snap slot to assemble the radiator on the lower separation plate.

* * * * *